(12) United States Patent
Sharma et al.

(10) Patent No.: US 11,574,910 B2
(45) Date of Patent: Feb. 7, 2023

(54) DEVICE WITH AIR-GAPS TO REDUCE COUPLING CAPACITANCE AND PROCESS FOR FORMING SUCH

(71) Applicant: Intel Corporation, Santa Clara, CA (US)

(72) Inventors: Abhishek Sharma, Hillsboro, OR (US); Willy Rachmady, Beaverton, OR (US); Van H. Le, Portland, OR (US); Travis W. Lajoie, Forest Grove, OR (US); Urusa Alaan, Hillsboro, OR (US); Hui Jae Yoo, Portland, OR (US); Sean Ma, Portland, OR (US); Aaron Lilak, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 709 days.

(21) Appl. No.: 16/457,677

(22) Filed: Jun. 28, 2019

(65) Prior Publication Data

US 2020/0411526 A1 Dec. 31, 2020

(51) Int. Cl.
*H01L 27/108* (2006.01)
*H01L 21/764* (2006.01)
*H01L 27/12* (2006.01)

(52) U.S. Cl.
CPC ...... *H01L 27/10814* (2013.01); *H01L 21/764* (2013.01); *H01L 27/10852* (2013.01); *H01L 27/1255* (2013.01)

(58) Field of Classification Search
CPC ............. H01L 27/10814; H01L 21/764; H01L 27/10852; H01L 27/1255
See application file for complete search history.

(56) References Cited

U.S. PATENT DOCUMENTS 6,501,120 B1 * 12/2002 Tu ..................... H01L 27/10888
257/E21.018

* cited by examiner

*Primary Examiner* — David Vu
(74) *Attorney, Agent, or Firm* — Schwabe, Williamson & Wyatt, P.C.

(57) ABSTRACT

A device is disclosed. The device includes a plurality of capacitors, a transistor connected to each of the plurality of capacitors, and a first dielectric layer and a second dielectric layer on respective adjacent sides of adjacent capacitors of the plurality of capacitors. The first dielectric layer and the second dielectric layer include a top portion and a bottom portion, the top portion of the first dielectric layer and the top portion of the second dielectric layer extend from respective directions and meet at a top portion of a space between the adjacent capacitors, the bottom portion of the first dielectric layer and the bottom portion of the second dielectric layer extend from respective directions and meet at a bottom portion of a space between the adjacent capacitors. The device also includes one or more air-gaps surrounded by the first dielectric layer and the second dielectric layer on respective adjacent sides of the adjacent capacitors, the top portion of the first dielectric layer and the second dielectric layer between the adjacent capacitors, and the bottom portion of the first dielectric layer and the second dielectric layer between the adjacent capacitors.

14 Claims, 8 Drawing Sheets

DEVICE WITH AIR-GAPS TO REDUCE COUPLING CAPACITANCE AND PROCESS FOR FORMING SUCH

TECHNICAL FIELD

Embodiments of the disclosure pertain to devices with air-gaps and, in particular, to devices with air-gaps for reducing coupling capacitance.

BACKGROUND

Integrated circuits that include a plurality of vertically oriented capacitors that are adjacently positioned can be negatively impacted by capacitive coupling. It should be appreciated that increasing the distance between capacitors in order to decrease capacitive coupling can be impractical because of density limitations. Moreover, decreasing capacitor area can limit the amount of capacitance that can be provided. Some conventional approaches involve the use of low-k dielectric materials. In some cases these low-k dielectric materials can be doped to achieve even lower dielectric constants. However, these approaches are unsatisfactory as the capacity to reduce dielectric constants in this manner is limited.

DESCRIPTION OF THE EMBODIMENTS

Devices with air-gaps for reducing coupling capacitance are described. It should be appreciated that although embodiments are described herein with reference to example devices with air-gaps for reducing coupling capacitance, the disclosure is more generally applicable to devices with air-gaps for reducing coupling capacitance as well as other type devices with air-gaps for reducing coupling capacitance. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Integrated circuits that include a plurality of vertically oriented capacitors that are adjacently positioned can be negatively impacted by capacitive coupling. It should be appreciated that increasing the distance between capacitors in order to decrease capacitive coupling can be impractical because of density limitations. Moreover, decreasing capacitor area can limit the amount of capacitance that can be provided. Some conventional approaches use of low-k dielectric materials in order to decrease capacitive coupling. In some cases these low-k dielectric materials can be doped to achieve even lower dielectric constants. However, these approaches can be unsatisfactory as the capacity to reduce dielectric constants in this manner is limited.

An approach that addresses the shortcomings of previous approaches is disclosed and described herein. For example, as part of a disclosed process, devices are designed to include air-gaps between capacitors in order to reduce capacitive coupling. In another embodiment, in order to address capacitance limitations of current approaches, space between capacitors is used to form an additional capacitor conductor (e.g., plate) in order to increase the capacitor area and thus the capacitance that can be provided by the capacitor. In an embodiment, in this manner the capacitance that can be provided by the capacitor can more than doubled.

Figure 1:
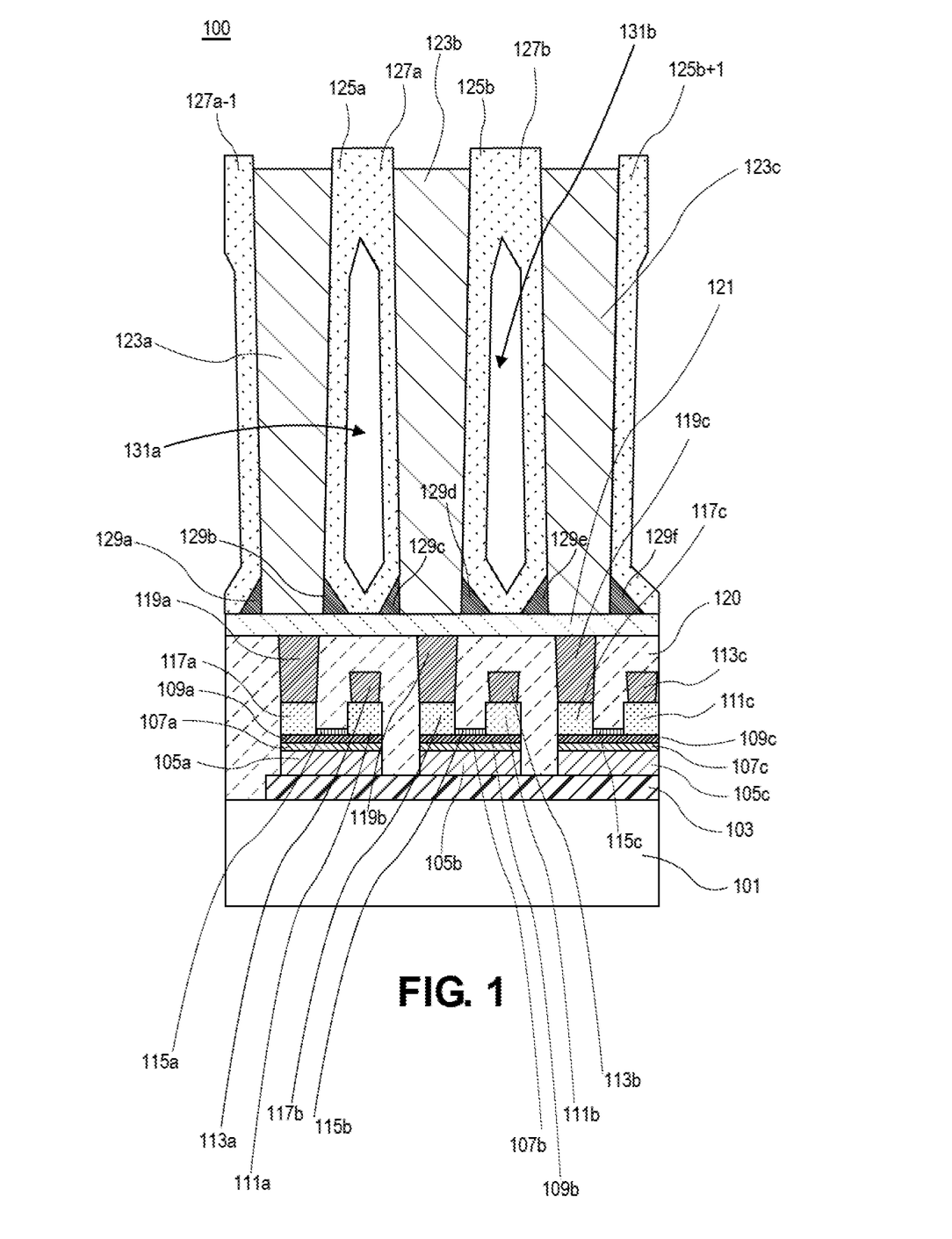
FIG. 1 illustrates a memory structure that includes capacitors with air-gaps to reduce coupling capacitance according to an embodiment.

FIG. 1 is an illustration of a memory structure 100 with vertical capacitors with air-gaps between the vertical capacitors that reduce coupling capacitance according to an embodiment. FIG. 1 shows interconnection 101, dielectric 103, gates 105a-105c, dielectric layers 107a-107c, channels 109a-109c, drain regions 111a-111c, bitline 113a-113c, passivation layers 115a-115c, source regions 117a-117c, source contact via 119a-119c, dielectric material 120, dielectric layer 121, capacitors 123a-123c, dielectric 125a-125b+1, dielectric 127a-1-127b, dielectric material 129a-129f, air-gap 131a and air-gap 131b.

Referring to FIG. 1, in an embodiment, the gates 105a-105c can be formed on the dielectric 103. The dielectric 103 can be formed on the interconnection 101. The dielectric layers 107a-107c can be formed on the top surface of the gates 105a-105c. The channels 109a-109c can be formed on the dielectric layers 107a-107c. The source regions 117a-117c and the drain regions 111a-111c can be formed on the channels 109a-109c. The passivation layers 115a-115c can be formed on the channels 109a-109c between the source regions 117a-117c and the drain regions 111a-111c. The bit lines 113a-113c can be connected to the drain regions 111a-111c and the source contact vias 119a-119c are formed on the source regions 117a-117c. The dielectric 121 is formed above the source contact vias 119a-119c. The capacitors 123a-123c are formed above the dielectric layer 121. The dielectric layers 125a-125b+1 and 127a-1-127b are formed on the respective sidewalls of the capacitors 123a-123c. In an embodiment, the dielectric layers 125a-125b+1 and 127a-1-127b can be formed by ALD or CVD. In other embodiments, the dielectric layers 125a-125b+1 and 127a-1-127b can be formed in other manners. The dielectric material 129a-129f is formed at the bottom side portions of the capacitors 123a-123c. The dielectric layers 125a-125b+1 and 127a-1-127b extend along the respective sides of the capacitors 123a-123c and come together at the top and the bottom of the space between the capacitors 123a-123c. The dielectric material 129a-129f is the remnant of dielectric material that has been recessed. The profile of the dielectric material 129a-129f can have a plurality of forms. It should be appreciated that the profile of the dielectric material 129a-129f depends on the process from which it is formed. For example, in an embodiment, a dry etch can result in a flat or spiked profile. Moreover, in an embodiment, a wet etch can result in a U-shaped or curved profile. Furthermore, in an embodiment, an atomic layer etch (ALE) can result in a flat or spiked profile. These profiles are detectable and are indicators of the process that caused them. The air-gaps 131a and 131b are defined by the parts of the dielectric layers 125a-125b+1 and 127a-1-127b that are formed on the sides of adjacent capacitors and the parts of the dielectric layers 125a-125b+1 and 127a-1-127b that come together at the top and the bottom of the space between the adjacent capacitors. It should be appreciated that the air in the air-gap has a very low-k dielectric constant. In an embodiment, during fabrication, the parts of the dielectric layers 125a-125b+1 and 127a-1-127b at the top of the space between the adjacent capacitors 123a-123c grow together and pinch-off. The portion of the dielectric layers 125a-125b+1 and 127a-1-127b that is pinched off closes the top of the cavities between the adjacent capacitors 123a-123c and defines the uppermost part of the air-gap. In an embodiment, the parts of the dielectric layers 125a-125b+1 and 127a-1-127b at the bottom of the adjacent capacitors 123a-123c make contact at the bottom of the space between the adjacent capacitors 123a-123c and define the bottommost parts of the air-gaps 131a and 131b. It should be appreciated that in an embodiment, the dielectric material 120 is formed between the interconnection 101 and the dielectric layer 121 and around the individual transistors of the memory structure 100.

In an embodiment, the interconnection 101 can be formed from copper or aluminum. In other embodiments, the interconnection 101 can be formed from other materials. In an embodiment, the dielectric 103 can be formed from silicon nitride or silicon oxide. In other embodiments, the dielectric 103 can be formed from other materials. In an embodiment, the gates 105a-105c can be formed from hafnium, zirconium, titanium, tantalum, aluminum, alloys of these metals, carbides of these metals, ruthenium, palladium, platinum, cobalt, nickel or conductive metal oxides. In other embodiments, the gates 105a-105c can be formed from other materials. In an embodiment, the gate dielectric layers 107a-107c can be formed from $HfO_2$, hBN, AlN, HfN, ZrN, YN, $Al_2O_3$, $SiO_2$, SiN, SiON, $ZrO_2$, $Y_2O_3$, $Ta_2O_5$, or $TiO_2$ or combinations and/or multilayers of these materials. In other embodiments, the gate dielectric layers 107a-107c can be formed from other material. In an embodiment, the channels 109a-109c can be formed from ZnO, $In_2O_3$, IGZO, ITO, IZO, CuOx, SnOx, Si (crystalline, poly or amorphous), Ge (crystalline, polycrystalline or amorphous), SiGe (same as Si, Ge), III-V materials such as InGaAs, GaN, or InN, TMDs such as InSe, InS, ZnS, ZnSe, MoSe, MoS, CuS, CuSe, ZnN, black phosphorus, graphene, HfS, HfSe, ZrS, ZrSe, AlS, AlSe, oxides, sulphides or selenides. In other embodiments, the channels 109a-109c can be formed from other materials. In an embodiment, the drain regions 111a-111c can be formed from silicon germanium, silicon carbide, germanium or a group III-V material or alloy. In other embodiments, the drain regions 111a-111c can be formed from other materials. In an embodiment, the bitlines 113a-113c can be formed from copper or aluminum. In other embodiments, the bitlines 113a-113c can be formed from other material. In an embodiment, the passivation dielectrics 115a-115c can be formed from hafnium oxide, aluminum oxide, silicon nitride, or silicon oxynitride. In other embodiments, the passivation dielectrics 115a-115c can be formed from other materials. In an embodiment, the source regions 117a-117c can be formed from silicon germanium, silicon carbide, germanium or a group III-V material or alloy. In other embodiments, the source regions 117a-117c can be formed from other materials. In an embodiment, the source contact vias 119a-119c can be formed from copper or aluminum. In other embodiments, the source contact vias 119-119c can be formed from other materials. In an embodiment, the dielectric 121 can be formed from silicon nitride. In other embodiments, the dielectric 121 can be formed from other materials. In an embodiment, the capacitors 123a-123c can be formed from titanium nitride, tantalum, tantalum nitride, tungsten, tungsten nitride hafnium, copper iridium, or ruthenium. In other embodiments, the capacitors 123a-123c can be formed from other materials. In an embodiment, the dielectric layers 125a-125b+1 and 127a-1-127b can be formed from silicon dioxide. In other embodiments, the dielectric layers 125a-125b+1 and 127a-1-127b can be formed from other dielectrics that have a lower-k than the dielectric material used inside the capacitor.

In operation, individual bits of data can be stored in individual capacitors 123a-123c within the memory structure 100. The capacitors 123a-123c can either be charged or discharged. The two states are taken to represent the two values of a bit, conventionally represented by 0 and 1. Parasitic capacitance can cause the bits stored by the capacitors 123a-123c to be unstable. In addition, parasitic capacitance can affect high speed operation and reduce bandwidth. In an embodiment, because of the lack of parasitic capacitance that is facilitated by the low-k air-gaps 131a and 131b, the data that is stored by the capacitors 123a-123c is more stable than data that is stored using conventional approaches. Moreover, the reduction in parasitic capacitance enables high speed operation and improves bandwidth.

Figure 2:
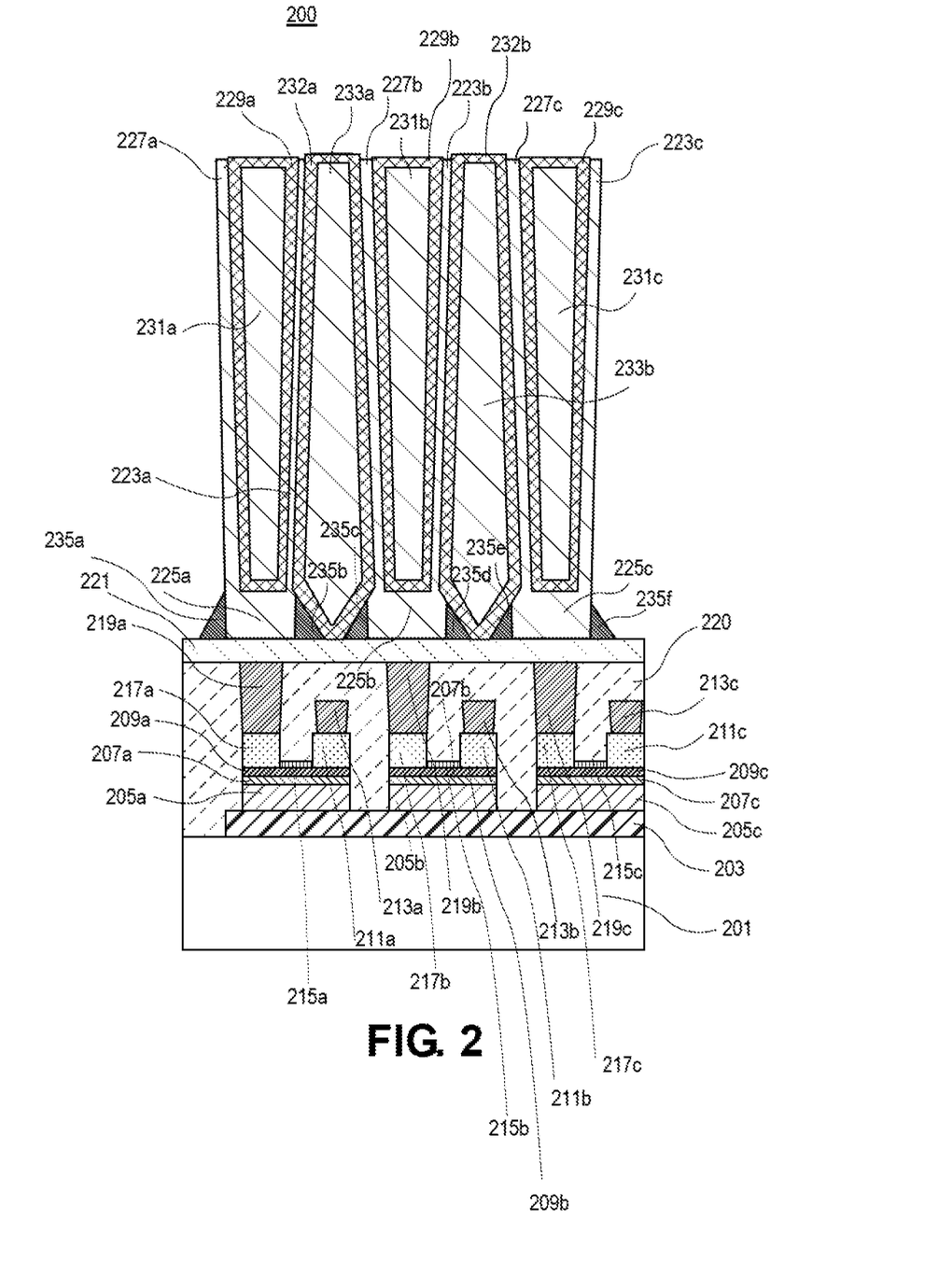
FIG. 2 illustrates a memory structure that includes double walled capacitors to increase capacitance according to an embodiment.

FIG. 2 is an illustration of a memory structure 200 that includes double walled capacitors that increase total capacitance per capacitor over bitline (COB) memory cell according to an embodiment. FIG. 2 shows interconnection 201, dielectric 203, gates 205a-205c, dielectric layers 207a-207c, channels 209a-209c, drain regions 211a-211c, bitline 213a-213c, passivation layers 215a-215c, source regions 217a-217c, source contact vias 219a-219c, dielectric material 220, dielectric 221, capacitor conductor wall 223a-223c, capacitor conductor base 225a-225c, capacitor conductor wall 227a-227c, dielectric layers 229a-229c, intra capacitor conductors 231a-231c, dielectric layers 232a-232b, inter capacitor conductor 233a, inter capacitor conductor 233b and dielectric material 235a-235f.

Referring to FIG. 2, the gates 205a-205c are formed on the dielectric 203. The dielectric 203 is formed on the interconnection 201. The dielectric layers 207a-207c are formed on the top surface of the gates 205a-205c. The channels 209a-209c are formed on the dielectric layers 207a-207c. The source regions 217a-217c and the drain regions 211a-211c are formed on the dielectric layers 207a-207c. The passivation layers 215a-215c are formed on the channel regions 209a-209c between the source regions 217a-217c and the drain regions 211a-211c. The bit lines 213a-213c are formed on the drain regions 211a-211c and the source contact vias 219a-219c are formed on the source regions 217a-217c. The dielectric 221 is formed above the source contact vias 219a-219c. The double walled capacitor includes capacitor conductor walls 223a-223c, capacitor conductor bases 225a-225c, and capacitor conductor walls 227a-227c. The capacitor conductor bases 225a-225c are formed on the dielectric 221. The capacitor conductor walls 223a-223c are connected to the capacitor conductor walls 227a-227c by the capacitor conductor bases 225a-225c. The dielectric 229a-229c is formed around the intra capacitor conductors 231a-231c. The dielectric layers 232a and 232b are formed around the inter capacitor conductors 233a and 233b. In an embodiment, the dielectric 229a-229c and 232a and 232b can be formed from a high k material such as $SiO_2$. In other embodiments, other high k materials can be used. In an embodiment, dielectric material can be formed on top portions of the capacitor conductor walls 223a-223c and 227a-227c (not shown in FIG. 2).

The dielectric material 235a-235f is the remnant of dielectric material that has been recessed. The profile of the dielectric material 235a-235f can have a plurality of forms. It should be appreciated that the profile of the dielectric material 235a-235f depends on the process from which it is formed. For example, in an embodiment, a dry etch can result in a flat or spiked profile. Moreover, in an embodiment, a wet etch can result in a U-shaped or curved profile. Furthermore, in an embodiment, an atomic layer etch (ALE) can result in a flat or spiked profile. These profiles are detectable and are indicators of the process that caused them. In an embodiment, components of the memory structure 200 of FIG. 2 that are analogous to components of the memory structure 100 of FIG. 1, can be formed from similar materials. As such, the material composition of the components of structure 200 that are analogous to components of memory structure 100 are not repeated here for purposes of clarity and brevity.

In operation, individual bits of data can be stored in individual capacitors within the integrated circuit 200. The capacitors can either be charged or discharged. In an embodiment, because of the additional capacitance that is provided by capacitor conductors 233a and 233b, sufficient capacitance can be provided to increasingly dense integrated circuit designs. For example, in an embodiment, the additional capacitor plate enables a provision of at least 2× the capacitance of conventional approaches that use the same amount of space. In an embodiment, the inter-COB dielectric can be recessed using ALE to control the second plate depth. In an embodiment, a post ALE fill with dielectric and oxide can be performed. In an embodiment, different oxides can be tuned inside and outside the COB. In addition, different metals can be used inside and outside the COB for purposes of work function tuning.

Figure 3A:
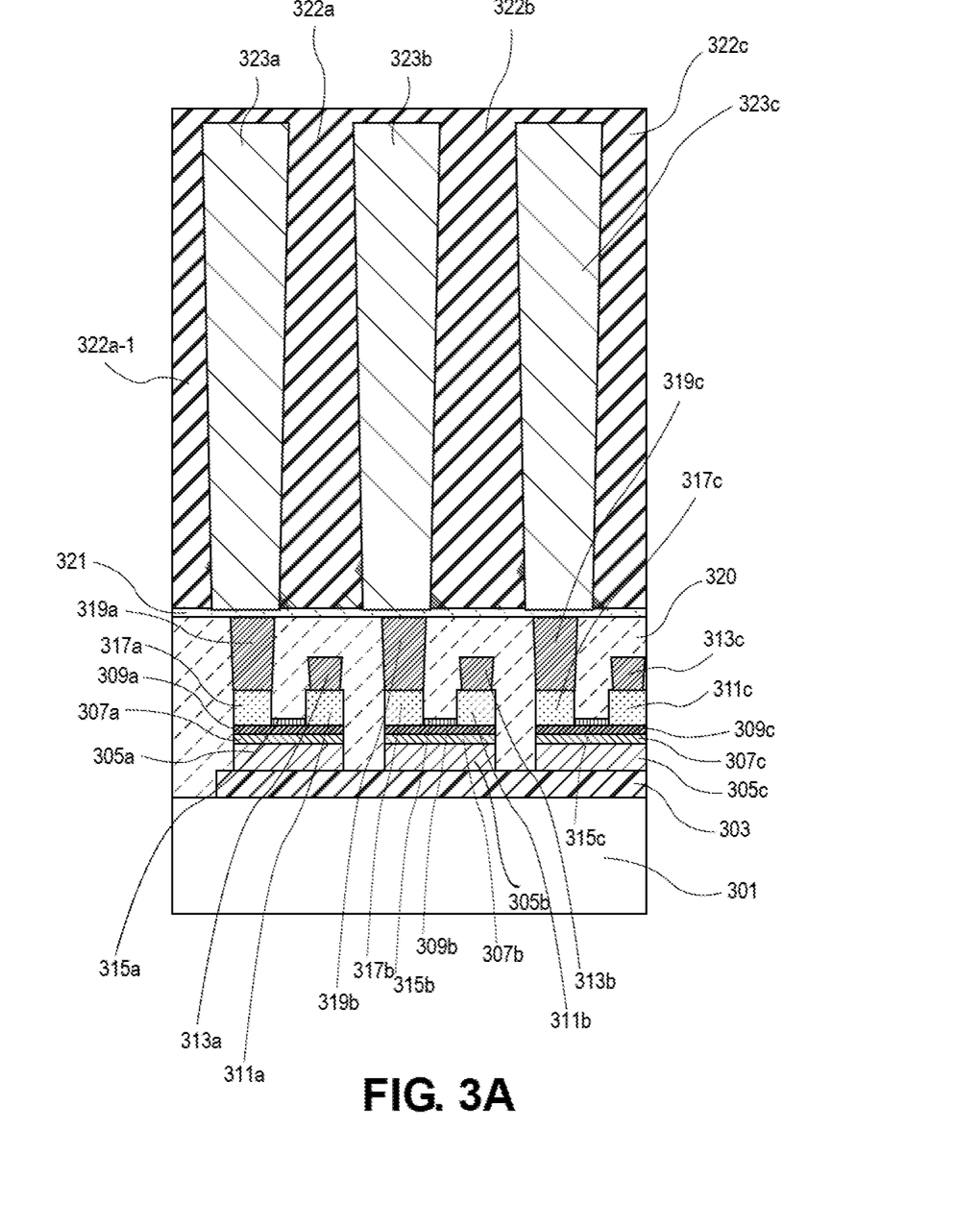
FIGS. 3A-3C illustrate cross-sections of a semiconductor structure at stages during a process for fabricating a memory structure that includes capacitors with air-gaps to reduce coupling capacitance according to an embodiment.
Figure 3B:
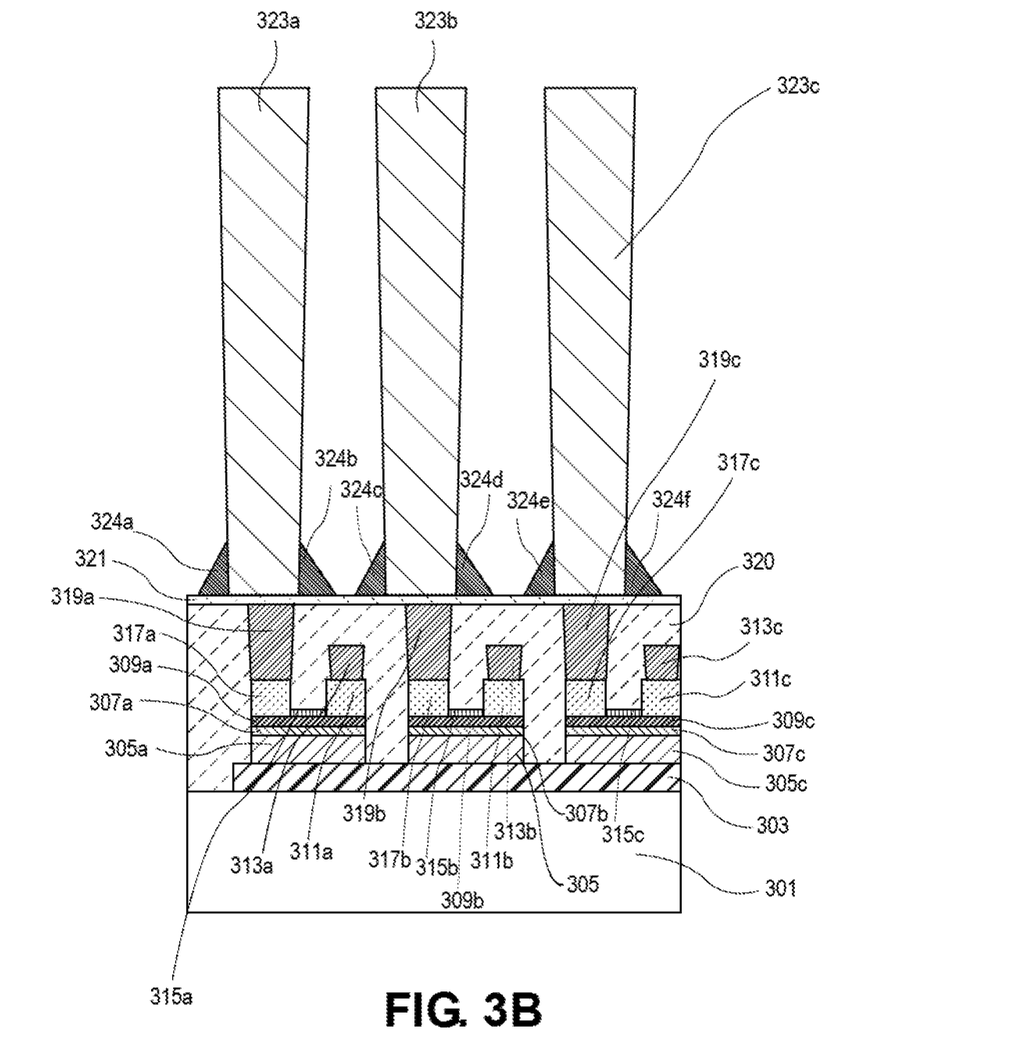
Figure 3C:
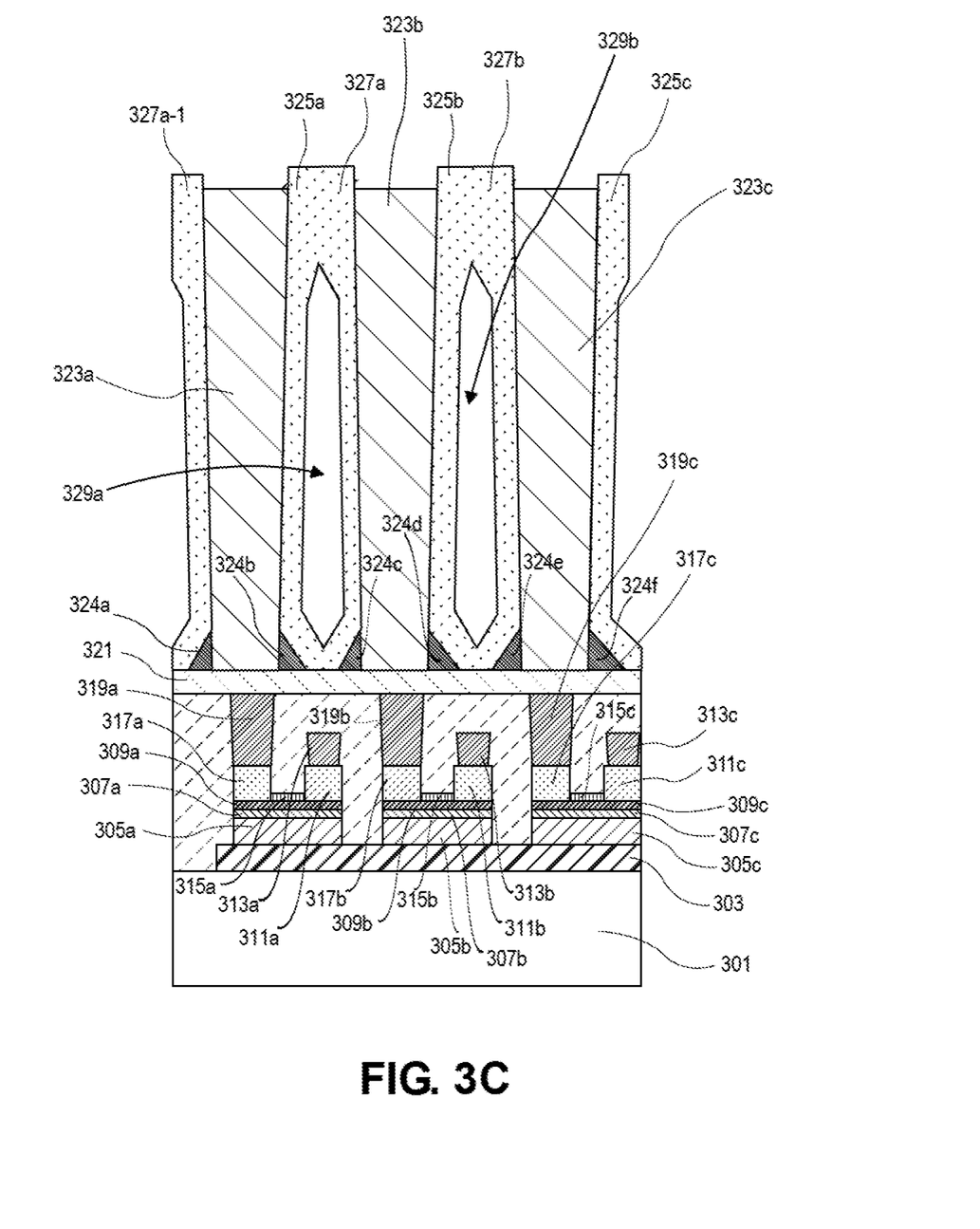

FIGS. 3A-3C illustrate cross-sections of a semiconductor structure at stages during a process for fabricating a memory structure that includes capacitors with air-gaps to reduce coupling capacitance according to an embodiment.

Referring to FIG. 3A, initial operations that are a part of the fabrication process result in the semiconductor cross-section that is depicted. In the embodiment of FIG. 3A, the semiconductor cross-section includes interconnection 301, dielectric 303, gates 305a-305c, dielectric layers 307a-307c, channels 309a-309c, drain regions 311a-311c, bitlines 313a-313c, passivation layers 315a-315c, source region 317a-317c, source contact vias 319a-319c, dielectric material 320, dielectric 321, dielectric material 322a-1-322c and capacitors 323a-323c.

Referring to FIG. 3B, subsequent to the initial operations that result in the cross-section shown in FIG. 3A, most of the dielectric material 322a-1-322c between and adjacent the capacitors 323a-323c is removed. In an embodiment, remnants of the dielectric material 322a-1-322c, in particular, the dielectric material 324a-324f, are left in the bottom of the trenches formed between the capacitors 323a-323c. In an embodiment, the dielectric material 322a-1-322c can be recessed by ALE operations. In other embodiments, the dielectric material 322a-1-322c can be recessed in other suitable manners. In an embodiment, as discussed herein, the profile of the dielectric material 324a-324f can have a plurality of characteristics. It should be appreciated that the profile of the dielectric material 324a-324f can depend on the process from which it is formed. For example, in an embodiment, a dry etch can result in a flat or spiked profile. Moreover, in an embodiment, a wet etch can result in a U-shaped or curved profile. Furthermore, in an embodiment, an atomic layer etch (ALE) can result in a flat or spiked profile.

Referring to FIG. 3C, subsequent to one or more operations that result in the cross-section shown in FIG. 3B, dielectric material 325a-325c and dielectric material 327a-1-327b are formed on the sides of the capacitors 323a-323c. The dielectric material 325a-325c and the dielectric material 327a-1-327b on the sides of the adjacent capacitor conductors extend from the top sides of adjacent capacitor conductors into the region between the capacitor conductors from respective directions and come together and pinch off to form the top surfaces of air-gaps 329a and 329b. The dielectric material 325a-325c and the dielectric material 327a-1-327b on the sides of adjacent capacitor conductors extend at bottom into the region between capacitor conductors from respective directions and come together to form the bottom surfaces of the air-gaps 329a and 329b. In an embodiment, the dielectric material 325a-325c and the dielectric material 327a-1-327b can be formed by ALD operations. In other embodiments, the dielectric material 325a-325c and the dielectric material 327a-1-327b can be formed in other manners.

Figure 4:
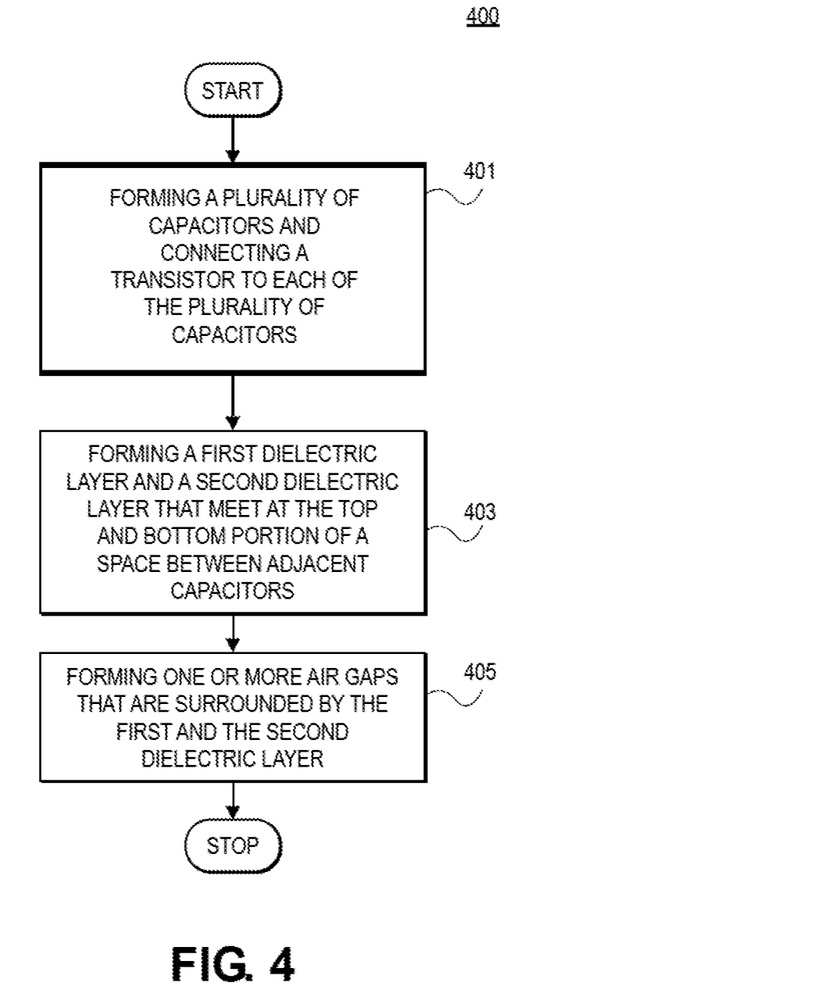
FIG. 4 illustrates a flowchart of a method for forming a memory device that includes capacitors with air-gaps to reduce coupling capacitance according to an embodiment

FIG. 4 is a flowchart of a method for forming a memory device that includes a capacitor over bitline structure according to an embodiment. Referring to FIG. 4, the method includes, at 401, forming a plurality of capacitors and connecting a transistor to each of the plurality of capacitors. At 403, forming a first dielectric layer and a second dielectric layer on respective adjacent sides of adjacent capacitors of the plurality of capacitors. In an embodiment, the first dielectric layer and the second dielectric layer include a top portion and a bottom portion, the top portion of the first dielectric layer and the top portion of the second dielectric layer extend from respective directions and meet at a top portion of a space between the adjacent capacitors, and the bottom portion of the first dielectric layer and the bottom portion of the second dielectric layer extend from respective directions and meet at a bottom portion of a space between the adjacent capacitors. At 405, forming one or more air-gaps surrounded by the first dielectric layer and the second dielectric layer on respective adjacent sides of the adjacent capacitors. In an embodiment, the top portion of the first dielectric layer and the second dielectric layer between the adjacent capacitors, and the bottom portion of the first dielectric layer and the second dielectric layer between the adjacent capacitors enclose the air-gaps.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 5:
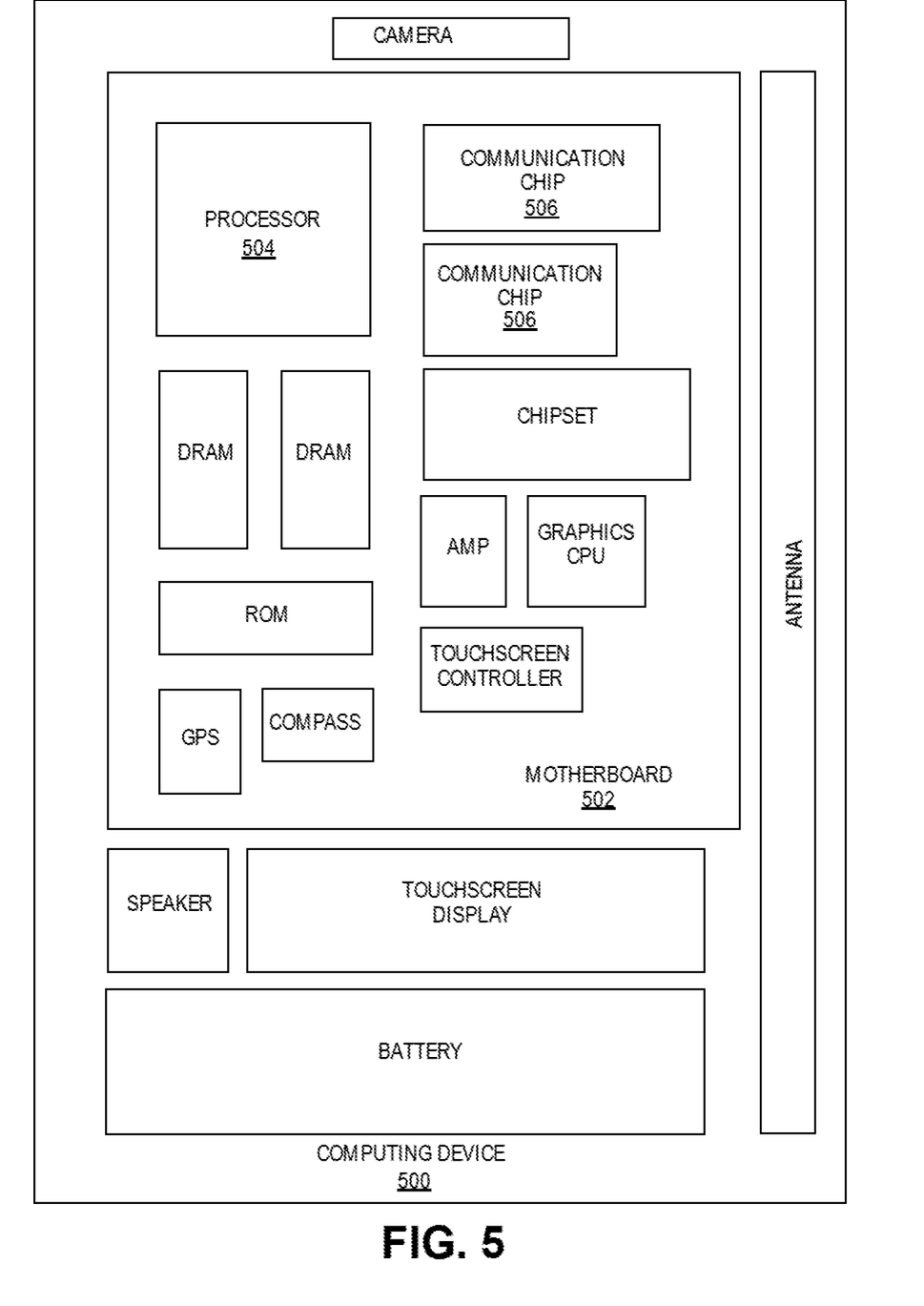
FIG. 5 illustrates a computing device in accordance with one implementation of the invention.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices, such as MOS-FET transistors built in accordance with implementations of the invention.

In further implementations, another component housed within the computing device 500 may contain an integrated circuit die that includes one or more devices, such as MOS-FET transistors built in accordance with implementations of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
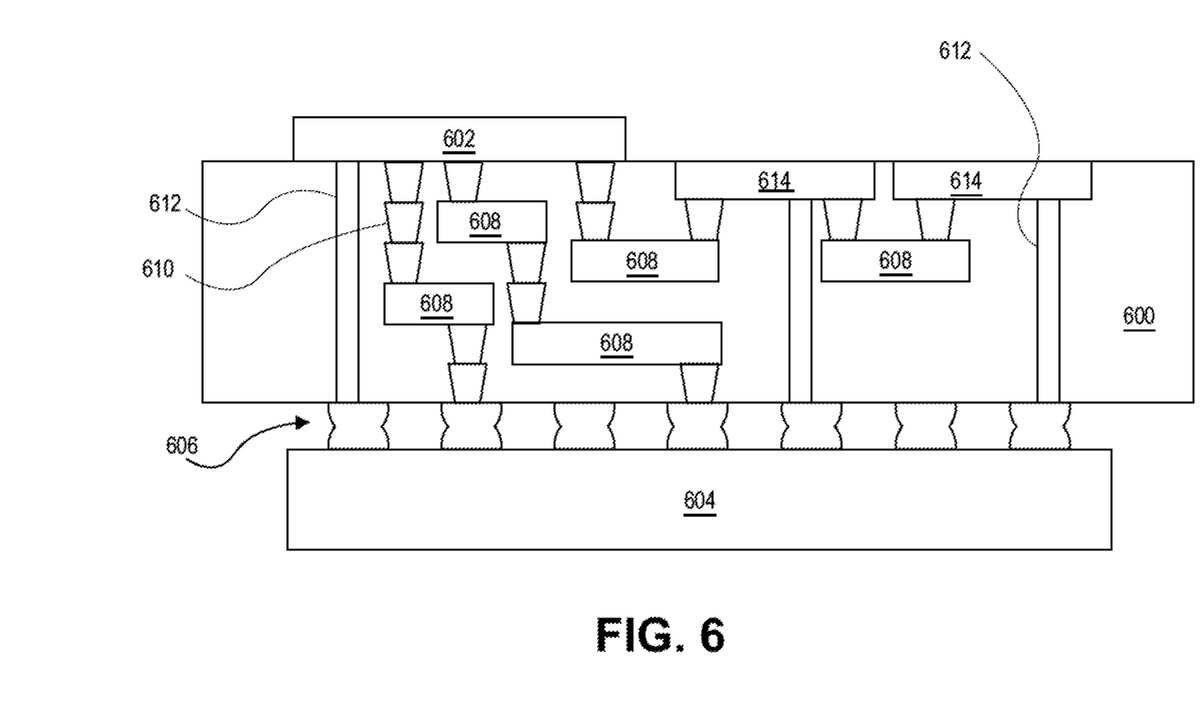
FIG. 6 illustrates an interposer that includes one or more embodiments of the invention.

FIG. 6 illustrates an interposer 600 that includes one or more embodiments of the invention. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer 600 may be formed of alternate rigid or flexible materials that may include the same materials described above for use in a semiconductor substrate, such as silicon, germanium, and other group III-V and group IV materials.

The interposer 600 may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the invention, apparatuses or processes disclosed herein may be used in the fabrication of interposer 600.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: A device, comprising: a plurality of capacitors; a transistor connected to each of the plurality of capacitors; a first dielectric layer and a second dielectric layer on respective adjacent sides of adjacent capacitors of the plurality of capacitors including a top portion and a bottom portion, the top portion of the first dielectric layer and the top portion of the second dielectric layer extend from respective directions and meet at a top portion of a space between the adjacent capacitors, the bottom portion of the first dielectric layer and the bottom portion of the second dielectric layer extend from respective directions and meet at a bottom portion of a space between the adjacent capacitors; and one or more air-gaps surrounded by the first dielectric layer and the second dielectric layer on respective adjacent sides of the adjacent capacitors, the top portion of the first dielectric layer and the second dielectric layer between the adjacent capacitors, and the bottom portion of the first dielectric layer and the second dielectric layer between the adjacent capacitors.

Example embodiment 2: The device of example embodiment 1, wherein the one or more air-gaps are between the adjacent capacitors of the plurality of capacitors.

Example embodiment 3: The device of example embodiment 1, or 2, wherein the one or more air-gaps are above a bit line contact of a memory cell associated with a capacitor of the plurality of capacitors.

Example embodiment 4: The device of example embodiment 1, further comprising a dielectric structure on a lower part of each of adjacent sides of adjacent capacitors of the plurality of capacitors.

Example embodiment 5: The device of example embodiment 4, wherein the dielectric structure on the lower part of each of the adjacent sides of the adjacent capacitors of the plurality of capacitors has a spiked or flat profile.

Example embodiment 6: The device of example embodiment 4, or 5, wherein the dielectric structure on the lower part of each of the adjacent sides of the adjacent capacitors of the plurality of capacitors has a curved or U-shaped profile.

Example embodiment 7: The device of example embodiment 4, 5, or 6, wherein the dielectric structure on the lower part of each of the adjacent sides of the adjacent capacitors of the plurality of capacitors is underneath bottom portions of the first dielectric layer and the second dielectric layer.

Example embodiment 8: A device, comprising: a plurality of double walled capacitors, the double walled capacitors including: a first conductive component that includes first and second vertically oriented conductive parts connected at bottom by a third conductive part; a second conductive component between the first and the second vertically oriented conductive parts of the first conductive component; and a first dielectric layer surrounding the second conductive components; a third conductive component between adjacent double walled capacitors of the plurality of double walled capacitors; and a second dielectric layer surrounding the third conductive component.

Example embodiment 9: The device of example embodiment 8, further comprising a transistor coupled to each of the plurality of double walled capacitors.

Example embodiment 10: The device of example embodiment 8, or 9, further comprising a dielectric structure on a lower part of each of adjacent sides of adjacent double walled capacitors of the plurality of double walled capacitors.

Example embodiment 11: The device of example embodiment 10, wherein the dielectric structure on the lower part of each of the adjacent sides of the adjacent double walled capacitors has a spiked or flat profile.

Example embodiment 12: The device of example embodiment 10, wherein the dielectric structure on the lower part of each of the adjacent sides of the adjacent double walled capacitors has a curved or U-shaped profile.

Example embodiment 13: The device of example embodiment 10, 11, or 12, wherein the profile of the dielectric structure is coincident with the profile of a bottom portion of the third conductive component.

Example embodiment 14: The device of example embodiment 8, 9, 10, 11, 12, or 13, further comprising a dielectric layer underneath the plurality of double walled capacitors.

Example embodiment 15: A system, including: a processor; and a data storage component, the data storage component comprising: a device, comprising: a plurality of capacitors; a transistor connected to each of the plurality of capacitors; a first dielectric layer and a second dielectric layer on respective adjacent sides of adjacent capacitors of the plurality of capacitors including a top portion and a bottom portion, the top portion of the first dielectric layer and the top portion of the second dielectric layer extend from respective directions and meet at a top portion of a space between the adjacent capacitors, the bottom portion of the first dielectric layer and the bottom portion of the second dielectric layer extend from respective directions and meet at a bottom portion of a space between the adjacent capacitors; and one or more air-gaps surrounded by the first dielectric layer and the second dielectric layer on respective adjacent sides of the adjacent capacitors, the top portion of the first dielectric layer and the second dielectric layer between the adjacent capacitors, and the bottom portion of the first dielectric layer and the second dielectric layer between the adjacent capacitors.

Example embodiment 16: The system of example embodiment 15, wherein the one or more air-gaps are between the adjacent capacitors of the plurality of capacitors.

Example embodiment 17: The system of example embodiment 15 or 16, wherein the one or more air-gaps are above a bit line contact of a memory cell associated with a capacitor of the plurality of capacitors.

Example embodiment 18: The system of example embodiment 15, 16, or 17, further comprising a dielectric structure on a lower part of each of adjacent sides of adjacent capacitors of the plurality of capacitors.

Example embodiment 19: The system of example embodiment 18, wherein the dielectric structure on the lower part of each of the adjacent sides of the adjacent capacitors of the plurality of capacitors has a spiked or flat profile.

Example embodiment 20: The system of example embodiment 18, wherein the dielectric structure on the lower part of each of the adjacent sides of the adjacent capacitors of the plurality of capacitors has a curved or U-shaped profile.

Example embodiment 21: The system of example embodiment 18, 19, or 20, wherein the dielectric structure on the lower part of each of the adjacent sides of the adjacent capacitors of the plurality of capacitors is underneath bottom portions of the first dielectric layer and the second dielectric layer.

Example embodiment 22: A method, comprising: forming a plurality of capacitors that are separated by dielectric material; removing a part of the dielectric material from between the plurality of capacitors to create a space between the capacitors; and forming a conformal dielectric layer on respective adjacent sides of adjacent capacitors of the plurality of capacitors including a top portion and a bottom portion wherein the top portion is pinched off to form an air-gap and the bottom portion covers remaining parts of the dielectric material.

Example embodiment 23: The method of example embodiment 22, further comprising forming a plurality of transistors that are connected respectively to the plurality of capacitors.

Example embodiment 24: The method of example embodiment 22 or 23, wherein the removing the dielectric material includes recessing the dielectric material using atomic layer etching (ALE).

Example embodiment 25: The method of example embodiment 22, 23, or 24, wherein the forming the conformal dielectric layer includes forming the dielectric material using atomic layer deposition (ALD).

Example embodiment 26: The method of example embodiment 22, 23, 24, or 25, wherein the removing includes performing a wet etch of the dielectric material.

Example embodiment 27: The method of example embodiment 22, 23, 24, or 25, wherein the removing includes performing a dry etch of the dielectric material.

What is claimed is:

1. A device, comprising:
a plurality of capacitors;
a transistor connected to each of the plurality of capacitors;
a first dielectric layer and a second dielectric layer on respective adjacent sides of adjacent capacitors of the plurality of capacitors including a top portion and a bottom portion, the top portion of the first dielectric layer and the top portion of the second dielectric layer extend from respective directions and meet at a top portion of a space between the adjacent capacitors, the bottom portion of the first dielectric layer and the bottom portion of the second dielectric layer extend from respective directions and meet at a bottom portion of a space between the adjacent capacitors; and
one or more air-gaps surrounded by, the first dielectric layer and the second dielectric layer on respective adjacent sides of the adjacent capacitors, the top portions of the first dielectric layer and the second dielectric layer between the adjacent capacitors, and the bottom portions of the first dielectric layer and the second dielectric layer between the adjacent capacitors.

2. The device of claim 1, wherein the one or more air-gaps are between the adjacent capacitors of the plurality of capacitors.

3. The device of claim 1, wherein the one or more air-gaps are above a bit line contact of a memory cell associated with a capacitor of the plurality of capacitors.

4. The device of claim 1, further comprising a dielectric structure on a lower part of each of adjacent sides of adjacent capacitors of the plurality of capacitors.

5. The device of claim 4, wherein the dielectric structure on the lower part of each of the adjacent sides of the adjacent capacitors of the plurality of capacitors has a spiked or flat profile.

6. The device of claim 4, wherein the dielectric structure on the lower part of each of the adjacent sides of the adjacent capacitors of the plurality of capacitors has a curved or U-shaped profile.

7. The device of claim 4, wherein the dielectric structure on the lower part of each of the adjacent sides of the adjacent capacitors of the plurality of capacitors is underneath bottom portions of the first dielectric layer and the second dielectric layer.

8. A system, including:
a processor; and
a data storage component, at least one of the processor and the data storage component comprising:
a device, comprising:
a plurality of capacitors;
a transistor connected to each of the plurality of capacitors;
a first dielectric layer and a second dielectric layer on respective adjacent sides of adjacent capacitors of the plurality of capacitors including a top portion and a bottom portion, the top portion of the first dielectric layer and the top portion of the second dielectric layer extend from respective directions and meet at a top portion of a space between the adjacent capacitors,
the bottom portion of the first dielectric layer and the bottom portion of the second dielectric layer extend from respective directions and meet at a bottom portion of a space between the adjacent capacitors; and
one or more air-gaps surrounded by the first dielectric layer and the second dielectric layer on respective adjacent sides of the adjacent capacitors, the top portion of the first dielectric layer and the second dielectric layer between the adjacent capacitors, and the bottom portion of the first dielectric layer and the second dielectric layer between the adjacent capacitors.

9. The system of claim 8, wherein the one or more air-gaps are between the adjacent capacitors of the plurality of capacitors.

10. The system of claim 8, wherein the one or more air-gaps are above a bit line contact of a memory cell associated with a capacitor of the plurality of capacitors.

11. The system of claim 8, further comprising a dielectric structure on a lower part of each of adjacent sides of adjacent capacitors of the plurality of capacitors.

12. The system of claim 11, wherein the dielectric structure on the lower part of each of the adjacent sides of the adjacent capacitors of the plurality of capacitors has a spiked or flat profile.

13. The system of claim 11, wherein the dielectric structure on the lower part of each of the adjacent sides of the adjacent capacitors of the plurality of capacitors has a curved or U-shaped profile.

14. The system of claim 11, wherein the dielectric structure on the lower part of each of the adjacent sides of the adjacent capacitors of the plurality of capacitors is underneath bottom portions of the first dielectric layer and the second dielectric layer.

* * * * *